US011860508B2

(12) United States Patent
Sato et al.

(10) Patent No.: US 11,860,508 B2
(45) Date of Patent: Jan. 2, 2024

(54) LIGHT-EMITTING SYSTEM

(71) Applicant: Panasonic Intellectual Property Management Co., Ltd., Osaka (JP)

(72) Inventors: Toshihiko Sato, Osaka (JP); Yosuke Mizokami, Hyogo (JP); Norishige Nanai, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/919,261

(22) PCT Filed: Apr. 20, 2021

(86) PCT No.: PCT/JP2021/016013
§ 371 (c)(1),
(2) Date: Oct. 15, 2022

(87) PCT Pub. No.: WO2021/215432
PCT Pub. Date: Oct. 28, 2021

(65) Prior Publication Data
US 2023/0152666 A1    May 18, 2023

(30) Foreign Application Priority Data

Apr. 24, 2020  (JP) ................................. 2020-077827

(51) Int. Cl.
*G02F 1/365* (2006.01)
*G02F 1/35* (2006.01)

(52) U.S. Cl.
CPC .............. *G02F 1/365* (2013.01); *G02F 1/353* (2013.01)

(58) Field of Classification Search
CPC .................. G02F 1/353; G02F 1/365
See application file for complete search history.

(56) References Cited

U.S. PATENT DOCUMENTS 6,490,309 B1    12/2002   Okazaki et al.
6,529,314 B1 *   3/2003   Shukunami ......... H01S 3/06754
                                                            359/332

(Continued)

FOREIGN PATENT DOCUMENTS

JP    2001-036168 A    2/2001
JP    2001-264662 A    9/2001

(Continued)

OTHER PUBLICATIONS

International Search Report and Written Opinion for International Application No. PCT/JP2021/016012, dated Jul. 13, 2021.

(Continued)

*Primary Examiner* — Daniel Petkovsek
(74) *Attorney, Agent, or Firm* — Renner, Otto, Boisselle & Sklar, LLP

(57) ABSTRACT

A light-emitting system includes an optical fiber, a first light source unit, a second light source unit, and a light-guiding member. The optical fiber includes a wavelength-converting portion containing a wavelength-converting element. The wavelength-converting element may be excited by excitation light to produce a spontaneous emission of light having a longer wavelength than the excitation light and may also be excited by an amplified spontaneous emission of light. The first light source unit makes the excitation light incident on the optical fiber. The second light source unit makes seed light, causing the wavelength-converting element that has been excited by either the excitation light or the amplified spontaneous emission of light to produce a stimulated emission of light, incident on the optical fiber. The light-guiding member guides the light coming from the optical fiber and lets the light emerge therefrom.

7 Claims, 6 Drawing Sheets

(56) References Cited

U.S. PATENT DOCUMENTS

| | | | |
|---|---|---|---|
| 7,630,126 B2* | 12/2009 | McKinstrie | G02F 1/395 |
| | | | 330/4.5 |
| 8,446,923 B2* | 5/2013 | Oba | H01S 3/2308 |
| | | | 372/6 |
| 10,003,168 B1 | 6/2018 | Villeneuve | |
| 2001/0022566 A1 | 9/2001 | Okazaki | |
| 2008/0036921 A1 | 2/2008 | Yokoyama et al. | |
| 2009/0067453 A1 | 3/2009 | Mizuuchi et al. | |
| 2010/0073638 A1 | 3/2010 | Yagyu | |
| 2012/0263198 A1 | 10/2012 | Oba et al. | |
| 2015/0318660 A1 | 11/2015 | Oba et al. | |
| 2017/0063019 A1 | 3/2017 | Yu et al. | |
| 2018/0017220 A1 | 1/2018 | Kitano | |
| 2018/0217482 A1 | 8/2018 | Nagao et al. | |
| 2018/0329130 A1 | 11/2018 | Tanaka | |
| 2022/0283354 A1* | 9/2022 | Aketa | H01S 3/1613 |

FOREIGN PATENT DOCUMENTS

| | | |
|---|---|---|
| JP | 2005-228566 A | 8/2005 |
| JP | 2007-165762 A | 6/2007 |
| JP | 2007-179823 A | 7/2007 |
| JP | 2010-078622 A | 4/2010 |
| JP | 2013-089469 A | 5/2013 |
| JP | 2013-145722 A | 7/2013 |
| JP | 2016-028371 A | 2/2016 |
| JP | 2018-010945 A | 1/2018 |
| JP | 2018-138991 A | 9/2018 |
| JP | 2018-195627 A | 12/2018 |
| JP | 2019-102387 A | 6/2019 |
| JP | 2019-145290 A | 8/2019 |
| JP | 2019-160456 A | 9/2019 |
| WO | 2006/049262 A1 | 5/2006 |
| WO | 2006/109730 A1 | 10/2006 |
| WO | 2007/069730 A1 | 6/2007 |
| WO | 2011/055812 A1 | 5/2011 |
| WO | 2013/051623 A1 | 4/2013 |
| WO | 2013/061590 A1 | 5/2013 |
| WO | 2013/111271 A1 | 8/2013 |
| WO | 2014/073237 A1 | 5/2014 |
| WO | 2017/204217 A1 | 11/2017 |

OTHER PUBLICATIONS

International Search Report and Written Opinion for International Application No. PCT/JP2021/016013, dated Jul. 13, 2021.
International Search Report and Written Opinion for International Application No. PCT/JP2021/016014, dated Jun. 29, 2021.
Commonly assigned, concurrently filed U.S. Appl. No. 17/919,260, which is a U.S. national stage application of PCT/JP2021/016012 (application previously provided; this corrected PTO/SB/08a Form submitted to reflect now available U.S. Patent App. No.).
Commonly assigned, concurrently filed U.S. Appl. No. 17/919,262, which is a U.S. national stage application of PCT/JP2021/016014 (application previously provided; this corrected PTO/ SB/08a Form submitted to reflect now available U.S. Patent App. No.).
Supplementary Partial European Search Report for corresponding European Patent Application No. 21793086.6, dated Sep. 29, 2023.

* cited by examiner

LIGHT-EMITTING SYSTEM

TECHNICAL FIELD

The present disclosure generally relates to a light-emitting system, and more particularly relates to a light-emitting system including an optical fiber.

BACKGROUND ART

A lighting fixture including a case, a projection lens, and a light source device has been proposed in the art (see, for example, Patent Literature 1). The light source device disclosed in Patent Literature 1 includes a solid-state light source and a light transmission fiber. The light transmission fiber has a first end face and a second end face, and excitation light emitted from the solid-state light source is introduced into the fiber through the first end face thereof. The light transmission fiber includes a wavelength-converting core, a light-guiding core, and a clad. The wavelength-converting core contains a wavelength-converting material that produces a population inversion state of electrons by absorbing the excitation light and that lets wavelength-converted light, falling within the visible radiation range, emerge therefrom. The light-guiding core covers the peripheral surface of the wavelength-converting core and transmits the wavelength-converted light in a direction from the first end face toward the second end face. The clad covers the peripheral surface of the light-guiding core.

The light transmission fiber is configured to have a stimulated emission produced by the wavelength-converted light propagating through the light-guiding core and to let not only the excitation light, emitted from the solid-state light source, but also the wavelength-converted light, amplified by the stimulated emission, emerge from the second end face.

It is difficult for the lighting fixture of Patent Literature 1 to increase the intensity of the wavelength-converted light.

CITATION LIST

Patent Literature

Patent Literature 1: JP 2018-195627 A

SUMMARY OF INVENTION

It is therefore an object of the present disclosure to provide a light-emitting system with the ability to increase the intensity of light having a different wavelength from excitation light.

A light-emitting system according to an aspect of the present disclosure includes an optical fiber, a first light source unit, a second light source unit, and a light-guiding member. The optical fiber includes a wavelength-converting portion containing a wavelength-converting element. The wavelength-converting element may be excited by excitation light to produce a spontaneous emission of light having a longer wavelength than the excitation light. The wavelength-converting element may also be excited by an amplified spontaneous emission of light. The first light source unit makes the excitation light incident on the optical fiber. The second light source unit makes seed light incident on the optical fiber. The seed light causes the wavelength-converting element that has been excited by either the excitation light or the amplified spontaneous emission of light to produce a stimulated emission of light. The light-guiding member guides the light coming from the optical fiber and lets the light emerge therefrom.

DESCRIPTION OF EMBODIMENTS

The drawings to be referred to in the following description of first to fourth embodiments are all schematic representations. That is to say, the ratio of the dimensions (including thicknesses) of respective constituent elements illustrated on the drawings does not always reflect their actual dimensional ratio.

First Embodiment

A light-emitting system 1 according to a first embodiment will be described with reference to FIGS. 1-3C.

(1) Overview

Figure 1:
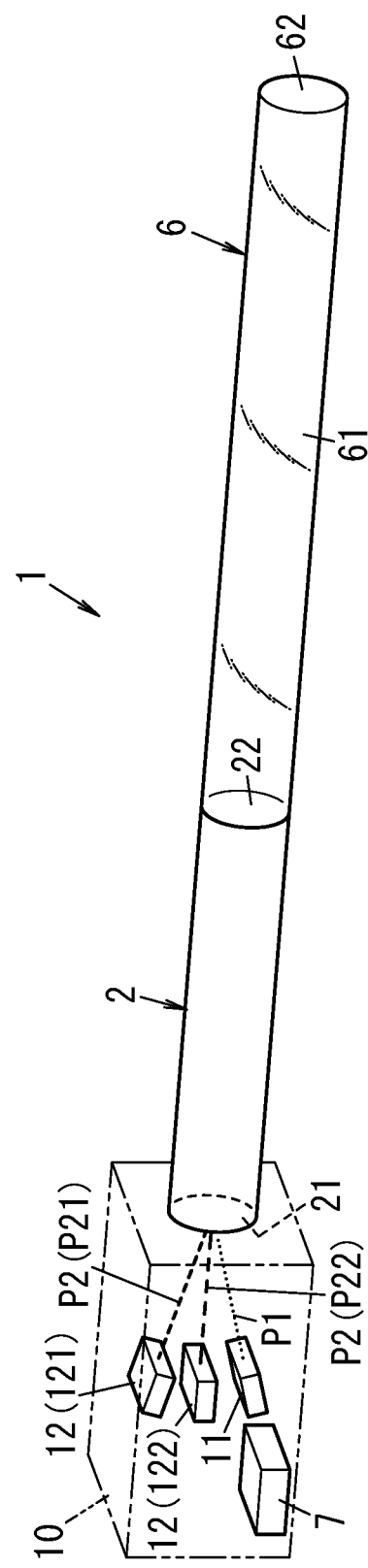
FIG. 1 illustrates a configuration for a light-emitting system according to a first embodiment.
Figure 2:
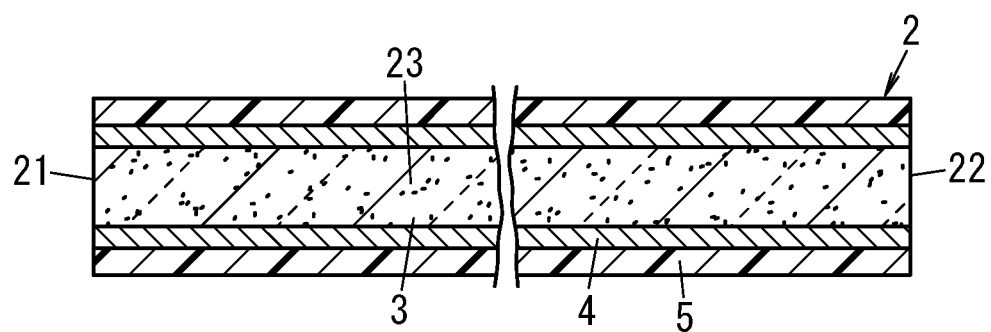
FIG. 2 is a cross-sectional view of an optical fiber included in the light-emitting system.
Figure 3A:
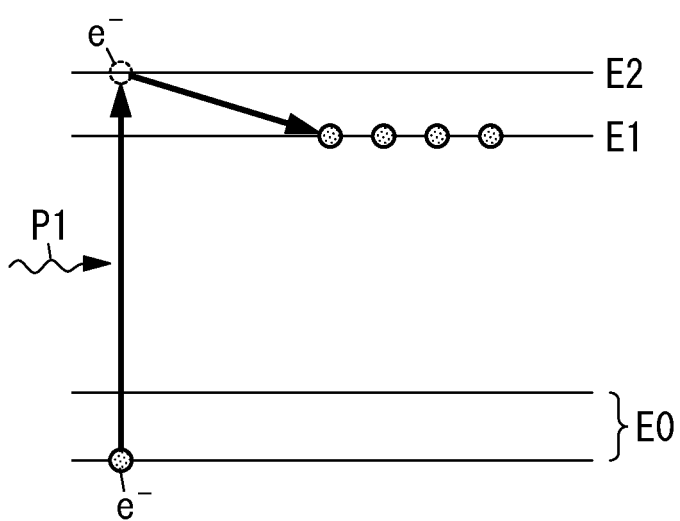
FIGS. 3A-3C illustrate an operating principle of the light-emitting system.
Figure 3B:
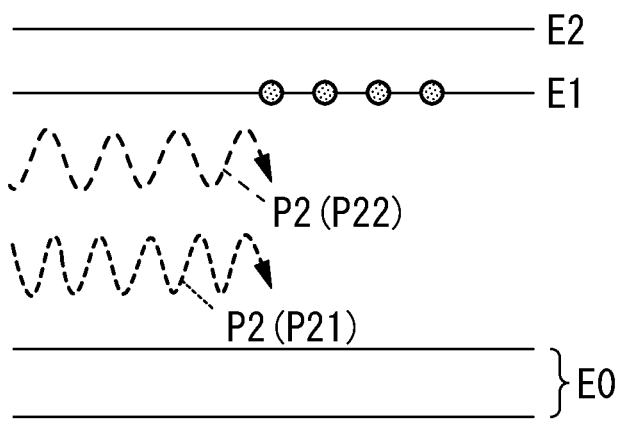
Figure 3C:
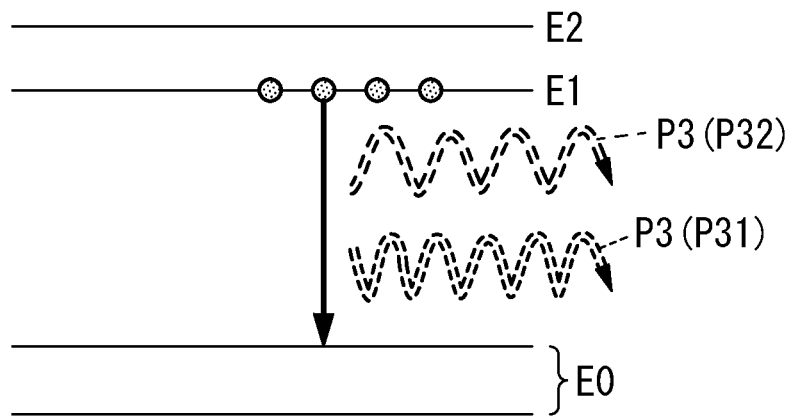

The light-emitting system 1 makes excitation light P1 and seed light P2 incident on an optical fiber 2 to which a wavelength-converting element (chemical element) is added as shown in FIGS. 1 and 2. The excitation light P1 excites the wavelength-converting element. The seed light P2 causes the wavelength-converting element that has been excited by the excitation light P1 to produce a stimulated emission of light P3 (see FIG. 3C). From the optical fiber 2, light including the excitation light P1 and the stimulated emission of light P3 emerges. FIGS. 3A-3C illustrate the principle of operation of the light-emitting system 1. In FIGS. 3A, 3B, and 3C, the ordinate represents the energy of electrons. The upward arrow shown in FIG. 3A indicates absorption of the excitation light P1. The downward arrow shown in FIG. 3C indicates transition about a spontaneous emission of light or a stimulated emission of light P3. In the light-emitting system 1, an electron $e^-$ in a ground state E0 (including a plurality of energy levels) of the wavelength-converting element is excited to an excitation level E2 by the excitation light P1 that has been incident on the optical fiber 2. Then, the electron $e^-$ at the excitation level E2 makes a transition to a metastable level E1, which is an energy level lower than the excitation level E2. Thereafter, the stimulated emission of light P3 (P32) is produced when the electron $e^-$ at the metastable level E1 is caused to make a transition to one of the highest ones of the plurality of energy levels (hereinafter referred to as a "second energy level") of the ground state E0 by the seed light P2 (P22), of which the wavelength corresponds to the difference in energy between the metastable level E1 and the second energy level, for example. In addition, a stimulated emission of light P3 (P31) is also produced when the electron $e^-$ at the metastable level E1 is caused to make a transition to another energy level (hereinafter referred to as a "first energy level"), lower than the second energy level out of the plurality of energy levels of the ground state E0, by the seed light P2 (P21), of which the wavelength corresponds to the difference in energy between the metastable level E1 and the first energy level.

The light-emitting system 1 may be used for lighting purposes, for example. However, this is only an example and should not be construed as limiting. Alternatively, the light-emitting system 1 may also be used for display and illumination purposes. The light-emitting system 1 may be applied to a facility or a moving vehicle, whichever is appropriate. Examples of facilities to which the light-emitting system 1 is applicable include warehouses, airports, single-family dwelling houses, multi-family dwelling houses, office buildings, stores, art museums, hotels, and factories. Examples of moving vehicles to which the light-emitting system 1 is applicable include automobiles, bicycles, railway trains, aircrafts, watercrafts, and drones.

(2) Configuration for Light-Emitting System

The light-emitting system 1 includes the optical fiber 2, a first light source unit 11, a second light source unit 12, and a light-guiding member 6 as shown in FIG. 1. The first light source unit 11 makes the excitation light P1 incident on a light incident portion 21 of the optical fiber 2. The second light source unit 12 makes the seed light P2, which causes the wavelength-converting element excited by the excitation light P1 to produce the stimulated emission of light P3 (hereinafter referred to as "external seed light P2"), incident on the light incident portion 21.

(2.1) Optical Fiber

The optical fiber 2 includes a core 3, a clad 4, and a coating portion 5 as shown in FIG. 2. The clad 4 covers the outer peripheral surface of the core 3. The coating portion 5 covers the outer peripheral surface of the clad 4. A cross section, taken along a plane perpendicular to the optical axis, of the core 3 has a circular shape. The clad 4 is disposed coaxially with the core 3.

The core 3 has a first end face and a second end face, which is located at the opposite longitudinal end of the core 3 from the first end face. The core 3 includes a light-transmitting material and the wavelength-converting element. The concentration of the wavelength-converting element in the core 3 may or may not be uniform along the entire length of the core 3. The refractive index of the core 3 may be substantially equal to the refractive index of the light-transmitting material that is a main component of the core 3.

The light-transmitting material may be, for example, a fluoride, an oxide, or a nitride. The fluoride may be glass fluoride, for example. The oxide may be a silicon oxide or quartz, for example.

The wavelength-converting element is a rare earth element. In this embodiment, the wavelength-converting element includes an element selected from the group consisting of, for example, Pr, Tb, Ho, Dy, Er, Eu, Nd, and Mn. The wavelength-converting element is contained as an ion of a rare earth element in the core 3, e.g., contained as an ion of Pr ($Pr^{3+}$) or an ion of Tb ($Tb^{3+}$) in the core 3. In this case, the wavelength-converting element may be excited by either the excitation light P1 or an amplified spontaneous emission (ASE) of light. The amplified spontaneous emission (ASE) of light is produced by amplifying the spontaneous emission of light, emitted from a different wavelength-converting element other than the wavelength-converting elements itself, as internal seed light. Through such excitation, the wavelength-converting element emits not only an ASE unique to the element of the wavelength-converting element but also a stimulated emission of light having the same wavelength as the external seed light P2, thus emitting them as the stimulated emission of light P3. The wavelengths of the ASE and the external seed light P2 are longer than the wavelength of the excitation light P1 (which may fall within the range from 440 nm to 450 nm, for example). The wavelength of the seed light P2 will be described later in the "(2.3) Second light source unit" section.

$Pr^{3+}$ is a wavelength-converting element that may emit either an ASE or amplified seed light in the cyan to red range. The intensity of the stimulated emission of light depends on the respective intensities of the internal seed light (the spontaneous emission of light) and the external seed light. If the core 3 contains $Pr^{3+}$ and $Tb^{3+}$, then $Tb^{3+}$ is excited by absorbing an ASE from $Pr^{3+}$ and may produce an ASE having a wavelength unique to $Tb^{3+}$.

The refractive index of the clad 4 is less than the refractive index of the core 3. The clad 4 does not contain the wavelength-converting element contained in the core 3.

The material of the coating portion 5 may be a resin, for example.

The optical fiber 2 includes the light incident portion 21, a light emerging portion 22, and a wavelength-converting portion 23.

The light incident portion 21 is a portion on which the excitation light P1 is incident and may include the first end face of the core 3, for example. The light emerging portion 22 includes the second end face of the core 3, through which light including the excitation light P1 and the stimulated emission of light P3 such as an ASE emerges.

The light incident portion 21 may include a reflection reducing portion for reducing the reflection of the excitation light P1 incident on the light incident portion 21 from outside of the optical fiber 2. The reflection reducing portion may be, for example, an anti-reflection coating that covers the first end face of the core 3.

The wavelength-converting portion 23 is provided between the light incident portion 21 and the light emerging portion 22. The wavelength-converting portion 23 contains a wavelength-converting element which is excited by the excitation light P1 to emit light having a longer wavelength than the excitation light P1. The wavelength-converting element is an element that may absorb the excitation light P1 and amplify, by stimulated emission, either the spontaneous emission of light or seed light having a longer wavelength than the excitation light P1.

The core 3 may have a diameter falling within the range from 25 μm to 500 μm, for example. The optical fiber 2 may have a length falling within the range from 3 m to 10 m, for example. As for the length of the wavelength-converting portion 23, the lower the concentration of the wavelength-converting element in the wavelength-converting portion 23 is, the greater the length of the wavelength-converting portion 23 preferably is. The optical fiber 2 may have a numerical aperture of 0.22, for example. The concentration of the wavelength-converting element in the wavelength-converting portion 23 is the concentration of the wavelength-converting element in the core 3.

(2.2) First Light Source Unit

The first light source unit 11 emits the excitation light P1 to excite the wavelength-converting element contained in the wavelength-converting portion 23 of the optical fiber 2. The excitation light P1 emitted from the first light source unit 11 is incident on the light incident portion 21 of the optical fiber 2. From the viewpoint of exciting the wavelength-converting element more efficiently, the excitation light P1 preferably has a wavelength equal to or longer than 350 nm and equal to or shorter than 500 nm.

The first light source unit 11 may include a laser light source, for example. The laser light source emits a laser beam. The excitation light P1 emitted from the first light source unit 11 (i.e., the laser beam emitted from the laser light source) is incident on the light incident portion 21. The laser light source may be, for example, a semiconductor laser diode that emits a blue laser beam. In that case, the excitation light P1 may have a wavelength falling within the range from 440 nm to 450 nm, for example.

(2.3) Second Light Source Unit

The second light source unit 12 emits the seed light P2. The seed light P2 emitted from the second light source unit 12 is incident on the light incident portion 21 of the optical fiber 2.

The light-emitting system 1 includes a plurality of (e.g., two) second light source units 12, each of which emits, for example, seed light P2 having a single wavelength. The seed light P2 emitted from one of these two second light source units 12 has a different wavelength from the seed light P2 emitted from the other of these two second light source units 12. In the following description, one of the two second light source units 12 will be hereinafter referred to as a "second light source unit 121" and the other second light source unit 12 will be hereinafter referred to as a "second light source unit 122" for convenience sake. The second light source unit 121 may be a semiconductor laser diode that emits a green light ray, for example. The second light source unit 122 may be a semiconductor laser diode that emits a red light ray, for example. If the wavelength-converting element of the wavelength-converting portion 23 includes $Pr^{3+}$, then the wavelength of the green seed light ray P21 is preferably about 520 nm, for example, and the wavelength of the red seed light ray P22 is preferably about 640 nm, for example. These second light source units 12 are light sources, each of which emits quasi-monochromatic light. As used herein, the "quasi-monochromatic light" refers to light falling within a narrow wavelength range (with a width of 10 nm, for example). The number of the second light source units 12 included in the light-emitting system 1 does not have to be two but may also be three or more or even one. If the light-emitting system 1 includes three second light source units 12, then the light-emitting system 1 may include, as the three second light source units 12, a semiconductor laser diode that emits a green light ray, a semiconductor laser diode that emits a red light ray, and a semiconductor laser diode that emits an orange light ray. The orange seed light ray preferably has a wavelength of about 600 nm, for example.

The light emitted from the second light source unit 121 is incident as a seed light ray P2 (P21) on the light incident portion 21 of the optical fiber 2. The light emitted from the second light source unit 122 is incident as a seed light ray P2 (P22) on the light incident portion 21 of the optical fiber 2.

(2.4) Light-Guiding Member

The light-guiding member 6 guides the light coming from the optical fiber 2 and lets the light emerge therefrom. The light-guiding member 6 has a side surface 61 and an end face 62 located opposite from the optical fiber 2. The light-guiding member 6 lets the light coming from the (light emerging portion 22 of the) optical fiber 2 emerge from at least the side surface 61. Optionally, the light-guiding member 6 may let the light coming from the optical fiber 2 emerge from not only the side surface 61 but also the end face 62 as well. The light-guiding member 6 is linear. The light-guiding member 6 has a circular cross-sectional shape taken along a plane that intersects at right angles with its longitudinal axis (i.e., its optical axis). The diameter of the light-guiding member 6 is preferably equal to or greater than the diameter of the core 3, for example, and may be approximately equal to the diameter of the optical fiber 2, for example. The light-guiding member 6 may be, but does not have to be, colorless and transparent, for example. A material for the light-guiding member 6 may be, for example, an acrylic resin. In the light-emitting system 1, the difference in refractive index between the light-guiding member 6 and the core 3 is preferably as small as possible. Optionally, at least part of the side surface 61 of the light-guiding member 6 may have an uneven structure for controlling the distribution of the light emerging from the light-guiding member 6.

The light-guiding member 6 is coupled to the optical fiber 2 to let the light coming from the optical fiber 2 incident on the light-guiding member 6. In this embodiment, the light-guiding member 6 is connected by fusion to the optical fiber 2. However, this is only an example and should not be construed as limiting. Alternatively, the light-guiding member 6 may be adhered to the optical fiber 2 via an adhesive which is transparent to visible radiation. In this case, the adhesive may be, for example, an epoxy resin or an acrylic resin. In this embodiment, the light-guiding member 6 has flexibility. However, the light-guiding member 6 may have no flexibility as well.

(2.5) Other Constituent Elements

The light-emitting system 1 includes a housing 10 to house the first light source unit 11 and the second light source unit 12 therein.

The light-emitting system 1 further includes an adjustment unit 7. The adjustment unit 7 adjusts the intensity of the seed light P2 having at least one wavelength. In the light-emitting system 1 according to the first embodiment, the adjustment unit 7 adjusts the intensity of the excitation light P1 and the respective intensities of seed light rays P21, P22. The adjustment unit 7 includes: a first driver circuit for driving the first light source unit 11; a plurality of second driver circuits, which are provided one to one for the plurality of second light source units 12 and each of which drives a corresponding one of the second light source units 12; and a control circuit for controlling the first driver circuit and the plurality of second driver circuits on an individual basis. In the adjustment unit 7, the control circuit controls the first driver circuit and the plurality of second driver circuits on an individual basis, thus making the chromaticity of the light emerging from the (light emerging portion 22 of the) optical fiber 2 adjustable. In short, the light-emitting system 1 includes the adjustment unit 7, thus enabling controlling the color of the emerging light. This allows the light-emitting system 1 to adjust the color of the light emerging from the light-guiding member 6. In this embodiment, the adjustment unit 7 is housed in the housing 10. However, this is only an example and the adjustment unit 7 does not have to be housed in the housing 10. The first driver circuit and the plurality of second driver circuits are supplied with supply voltage from a first power supply circuit, for example. Meanwhile, the control circuit is supplied with supply voltage from a second power supply circuit, for example. In this embodiment, the first power supply circuit and the second power supply circuit are not counted among the constituent elements of the light-emitting system 1. However, this is only an example and should not be construed as limiting. Alternatively, the first power supply circuit and the second power supply circuit may be counted among constituent elements of the light-emitting system 1.

The light-emitting system 1 may further include a photocoupler to make the excitation light P1 and the seed light rays P2 incident on the light incident portion 21 of the optical fiber 2. The photocoupler is disposed at the opening of the housing 10. The photocoupler may be, but does not have to be, a grating. The grating may be a transmissive diffraction grating, for example. The material for the grating may be, but does not have to be, quartz, for example.

(3) Operation of Light-Emitting System

The light-emitting system 1 makes the first light source unit 11 emit the excitation light P1 and also makes the second light source unit 12 emit the seed light P2. Thus, the light-emitting system 1 allows the excitation light P1 and the seed light P2 to be incident on the light incident portion 21 of the optical fiber 2. Part of the excitation light P1 incident on the light incident portion 21 emerges from the light emerging portion 22. In the light-emitting system 1, the light emerging from the light emerging portion 22 of the optical fiber 2 is mixed light in which the excitation light P1, an ASE with a wavelength of about 480 nm and produced from the wavelength-converting element, and the stimulated emission of light (P3) (i.e., the light having the same wavelength as the seed light P2) are mixed together. Two types of stimulated emissions of light P31, P32 corresponding one to one to the multiple seed light rays P21, P22 and having mutually different wavelengths may be, for example, a green ray and a red ray, respectively. In that case, the mixed light may be white light, for example. In FIG. 3C, the lower stimulated emission of light P3 (P31) is the green ray and the upper stimulated emission of light P3 (P32) is the red ray.

In the optical fiber 2, a stimulated emission is produced by the spontaneous emission of light and the seed light P2, and therefore, the excitation light P1 incident on the light incident portion 21 and the stimulated emission of light P3 amplified by stimulated emission emerge from the light emerging portion 22. The stimulated emission of light P3 having the same wavelength as the seed light ray P21 of the light emerging from the light emerging portion 22 of the optical fiber 2 has a higher intensity than the seed light ray P21 incident from the second light source unit 121 onto the light incident portion 21. Also, the stimulated emission of light P3 having the same wavelength as the seed light ray P22 of the light emerging from the light emerging portion 22 of the optical fiber 2 has a higher intensity than the seed light ray P22 incident from the second light source unit 122 onto the light incident portion 21. The mixed light emerging from the light emerging portion 22 of the optical fiber 2 is incoherent light. In the light-emitting system 1, as the light incident through the light incident portion 21 of the optical fiber 2 comes closer toward the light emerging portion 22, the stimulated emission of light P3 increases or decreases. In the light-emitting system 1, the chromaticity, color temperature, color rendering index, and other parameters of the light emerging from the light-guiding member 6 are determined by the respective wavelengths of the ASE and the seed light P2. Note that the operation of the light-emitting system 1 is different from the operation of a fiber laser that produces laser oscillation.

In the light-emitting system 1, the wavelength-converting element that serves as a heat source is distributed in the core 3 of the optical fiber 2, and therefore, an increase in temperature may be reduced while the light-emitting system 1 is being used.

Also, in the light-emitting system 1, the adjustment unit 7 adjusts the intensity of the excitation light P1 and the respective intensities of the multiple seed light rays P2. However, this is only an example and should not be construed as limiting. Alternatively, the adjustment unit 7 may also be configured to adjust the intensity of the seed light P2 having at least one wavelength.

(4) Recapitulation

A light-emitting system 1 according to the first embodiment includes an optical fiber 2, a first light source unit 11, a second light source unit 12, and a light-guiding member 6. The optical fiber 2 includes a wavelength-converting portion 23 containing a wavelength-converting element. The wavelength-converting element may be excited by excitation light P1 to produce a spontaneous emission of light having a longer wavelength than the excitation light P1 and may also be excited by an amplified spontaneous emission of light. The first light source unit 11 makes the excitation light P1 incident on the optical fiber 2. The second light source unit 12 makes seed light P2 incident on the optical fiber 2. The seed light P2 causes the wavelength-converting element that has been excited by the excitation light P1 and the amplified spontaneous emission of light to produce a stimulated emission of light P3. The light-guiding member 6 guides the light coming from the optical fiber 2 and lets the light emerge therefrom.

The light-emitting system 1 according to the first embodiment enables increasing the intensity of light (i.e., the stimulated emission of light P3) having a different wavelength from the excitation light P1.

In addition, the light-emitting system 1 according to the first embodiment lets the light emerge from the light-guiding member 6 into the external space without using any lighting devices or lenses, thus contributing to reducing the size and weight.

Furthermore, in the light-emitting system 1 according to the first embodiment, the light-guiding member 6 is linear. Thus, the light-emitting system 1 contributes to reducing the size and weight of the light-guiding member 6 while expanding the irradiation range of the light emerging from the light-guiding member 6.

Furthermore, the light-emitting system 1 according to the first embodiment further includes an adjustment unit 7 for adjusting the respective intensities of multiple seed light rays P2 having multiple different wavelengths, thus making the chromaticity of the light emerging from the light-guiding member 6 adjustable.

In addition, in the light-emitting system 1 according to the first embodiment, the wavelength-converting portion 23 contains $Pr^{3+}$ as the wavelength-converting element. The wavelength-converting element not only emits an ASE in cyan but also increases the respective intensities of stimulated emissions in green and red, because a plurality of seed light rays P2 with mutually different wavelengths are incident onto the light incident portion 21. This allows the light-emitting system 1 according to the first embodiment to improve the color rendering index of the light emerging from the light-guiding member 6. Furthermore, in the light-emitting system 1 according to the first embodiment, the wavelength-converting portion 23 contains $Pr^{3+}$ and $Tb^{3+}$ as two types of wavelength-converting elements, thus enabling further improving the color rendering index of the light emerging from the light-guiding member 6.

Second Embodiment

Figure 4:
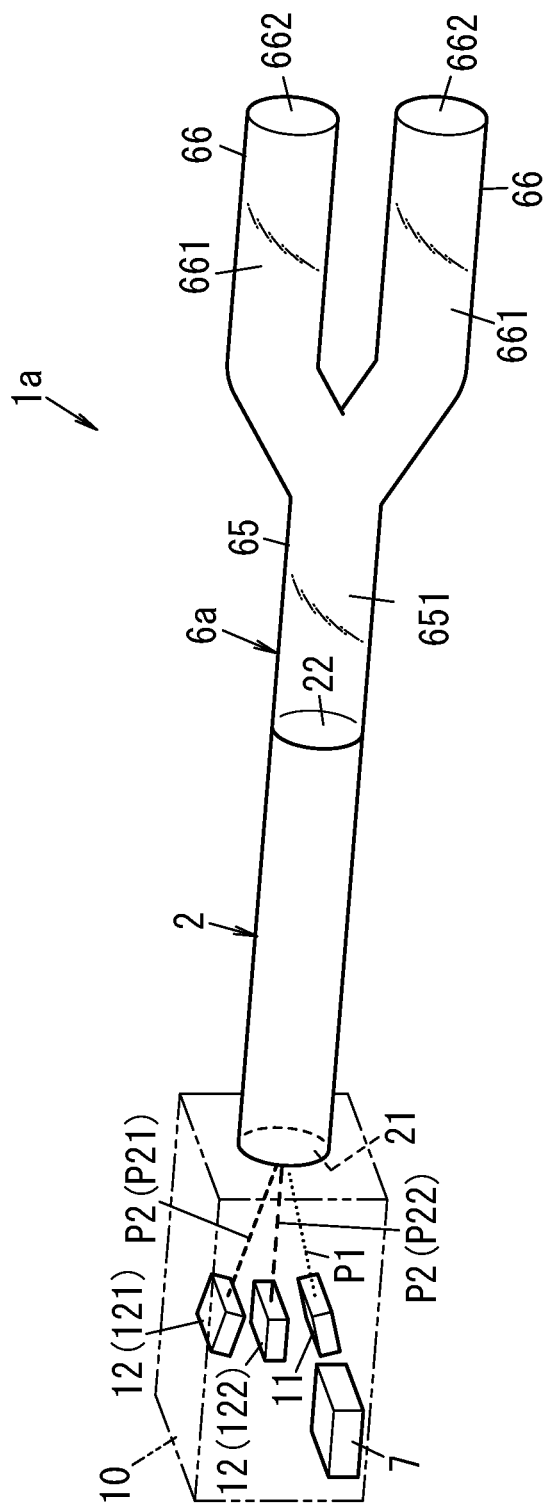
FIG. 4 illustrates a configuration for a light-emitting system according to a second embodiment.

Next, a light-emitting system 1a according to a second embodiment will be described with reference to FIG. 4. In the following description, any constituent element of the light-emitting system 1a according to this second embodiment, having the same function as a counterpart of the light-emitting system 1 of the first embodiment described above, will be designated by the same reference numeral as that counterpart's, and description thereof will be omitted herein.

The light-emitting system 1a according to the second embodiment includes a light-guiding member 6a instead of the light-guiding member 6 of the light-emitting system 1 according to the first embodiment, which is a difference from the light-emitting system 1 according to the first embodiment.

The light-guiding member 6a includes a first light-guiding portion 65, which is directly connected to the optical fiber 2, and a plurality of (e.g., two) second light-guiding portions 66 branching from the first light-guiding portion 65.

The light-guiding member 6a guides the light coming from the optical fiber 2 and lets the light emerge therefrom. The light-guiding member 6a has side surfaces (specifically, a side surface 651 of the first light-guiding portion 65 and respective side surfaces 661 of the plurality of second light-guiding portions 66) and end faces located opposite from the optical fiber 2 (specifically, the respective end faces 662 of the plurality of second light-guiding portions 66). The light-guiding member 6a lets the light coming from the (light emerging portion 22 of the) optical fiber 2 emerge from at least the side surfaces of the light-guiding member 6a. Optionally, the light-guiding member 6a may let the light coming from the optical fiber 2 emerge from not only the side surfaces of the light-guiding member 6a but also the end faces of the light-guiding member 6a as well. The first light-guiding portion 65 is linear. The first light-guiding portion 65 has a circular cross-sectional shape taken along a plane that intersects at right angles with its longitudinal axis (i.e., its optical axis). The diameter of the first light-guiding portion 65 is preferably equal to or greater than the diameter of the core 3 of the optical fiber 2 (see FIG. 3), for example, and may be approximately equal to the diameter of the optical fiber 2, for example. Each of the plurality of second light-guiding portions 66 has a circular cross-sectional shape taken along a plane that intersects at right angles with its longitudinal axis (i.e., its optical axis). The light-guiding member 6a may be, but does not have to be, colorless and transparent, for example. A material for the light-guiding member 6a may be, for example, an acrylic resin. In the light-emitting system 1a, the difference in refractive index between the light-guiding member 6a and the core 3 is preferably as small as possible. Optionally, at least part of the side surfaces of the light-guiding member 6a may have an uneven structure for controlling the distribution of the light emerging from the light-guiding member 6a.

In the light-guiding member 6a, the first light-guiding portion 65 is directly connected to the optical fiber 2 to let the light coming from the optical fiber 2 incident on the first light-guiding portion 65. In the light-guiding member 6a, the first light-guiding portion 65 is coupled to the optical fiber 2. In this embodiment, the light-guiding member 6a is connected by fusion to the optical fiber 2. However, this is only an example and should not be construed as limiting. Alternatively, the light-guiding member 6a may be adhered to the optical fiber 2 with, for example, an adhesive which is transparent to visible radiation. In this case, the adhesive may be, for example, an epoxy resin or an acrylic resin. In this embodiment, the light-guiding member 6a has flexibility. However, the light-guiding member 6 may have no flexibility as well.

The light-emitting system 1a according to the second embodiment includes, as well as the light-emitting system 1 according to the first embodiment, the wavelength-converting portion 23 (see FIG. 2) containing the wavelength-converting element, the first light source unit 11, the second light source unit 12, and the light-guiding member 6a. This allows the light-emitting system 1a according to the second embodiment, as well as the light-emitting system 1 according to the first embodiment, to increase the intensity of light (i.e., the stimulated emission of light P3) having a different wavelength from the excitation light P1.

In addition, in the light-emitting system 1a according to the second embodiment, the light-guiding member 6a includes the first light-guiding portion 65 and the plurality of second light-guiding portions 66, thus enabling expanding the irradiation range of the light emerging from the light-guiding member 6a.

Third Embodiment

Figure 5:
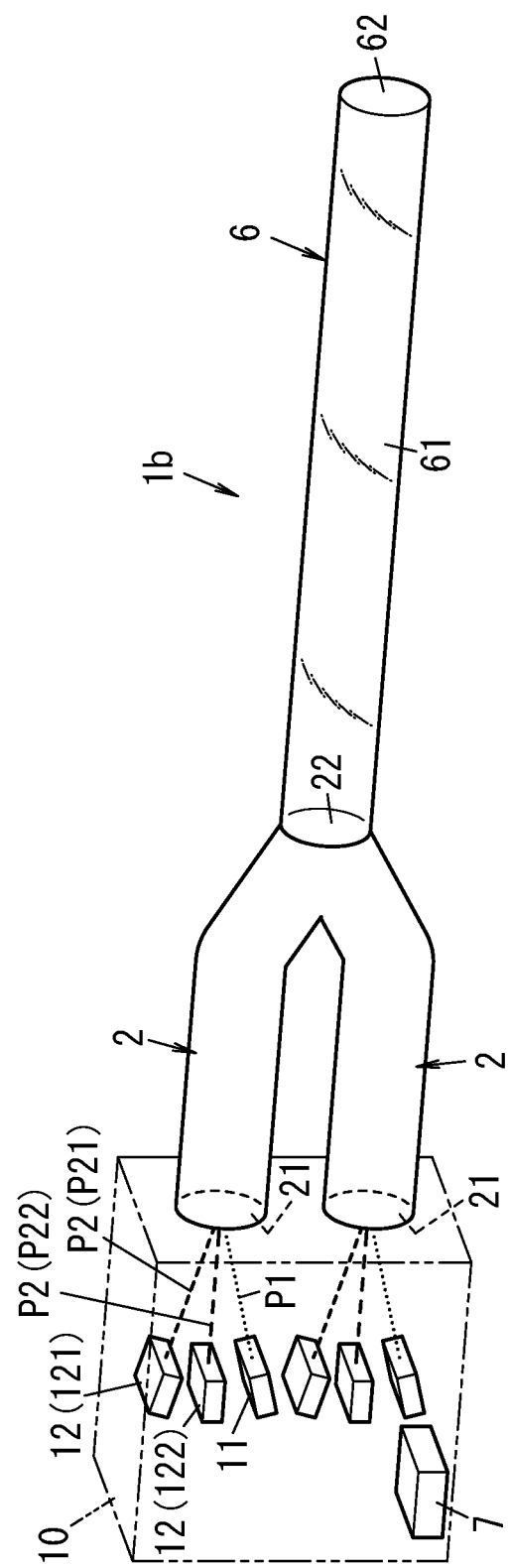
FIG. 5 illustrates a configuration for a light-emitting system according to a third embodiment.

Next, a light-emitting system 1b according to a third embodiment will be described with reference to FIG. 5. In the following description, any constituent element of the light-emitting system 1b according to this third embodiment, having the same function as a counterpart of the light-emitting system 1 of the first embodiment described above, will be designated by the same reference numeral as that counterpart's, and description thereof will be omitted herein.

The light-emitting system 1b includes a plurality of (e.g., two in the example illustrated in FIG. 5) optical fibers 2. On the other hand, the light-guiding member 6 guides the light coming from each of the plurality of optical fibers 2 and lets the light emerge therefrom. In this light-emitting system 1b, the respective light incident portions 21 of the plurality of optical fibers 2 are arranged out of contact with each other. In the light-emitting system 1b, the plurality of optical fibers 2 are bundled together (in other words, coupled together) at the other end opposite from the light incident portions 21 thereof and share the same light emerging portion 22 in common.

In this light-emitting system 1b, the first light source unit 11 and the plurality of (e.g., two) second light source units 12 are provided for each of the plurality of (e.g., two) optical fibers 2 In other words, the light-emitting system 1b includes two sets of light source units, each set of which consists of one first light source unit 11 and two second light source units 12. These two sets are housed in a single housing 10. The adjustment unit 7 controls the first light source unit 11 and the plurality of second light source unit 12 of each set.

The light-emitting system 1b according to the third embodiment includes, as well as the light-emitting system 1 according to the first embodiment, the wavelength-converting portions 23 (see FIG. 2) each containing the wavelength-converting element, the first light source units 11, the second light source units 12, and the light-guiding member 6. This allows the light-emitting system 1b according to the third embodiment to increase the intensity of light (i.e., the stimulated emission of light P3) having a different wavelength from the excitation light P1.

In addition, the light-emitting system 1b according to the third embodiment makes the light-guiding member 6 guide the light coming from each of the plurality of optical fibers 2 and lets the light emerge therefrom, thus enabling increasing the quantity of light emerging from the light-guiding member 6.

Fourth Embodiment

Figure 6A:
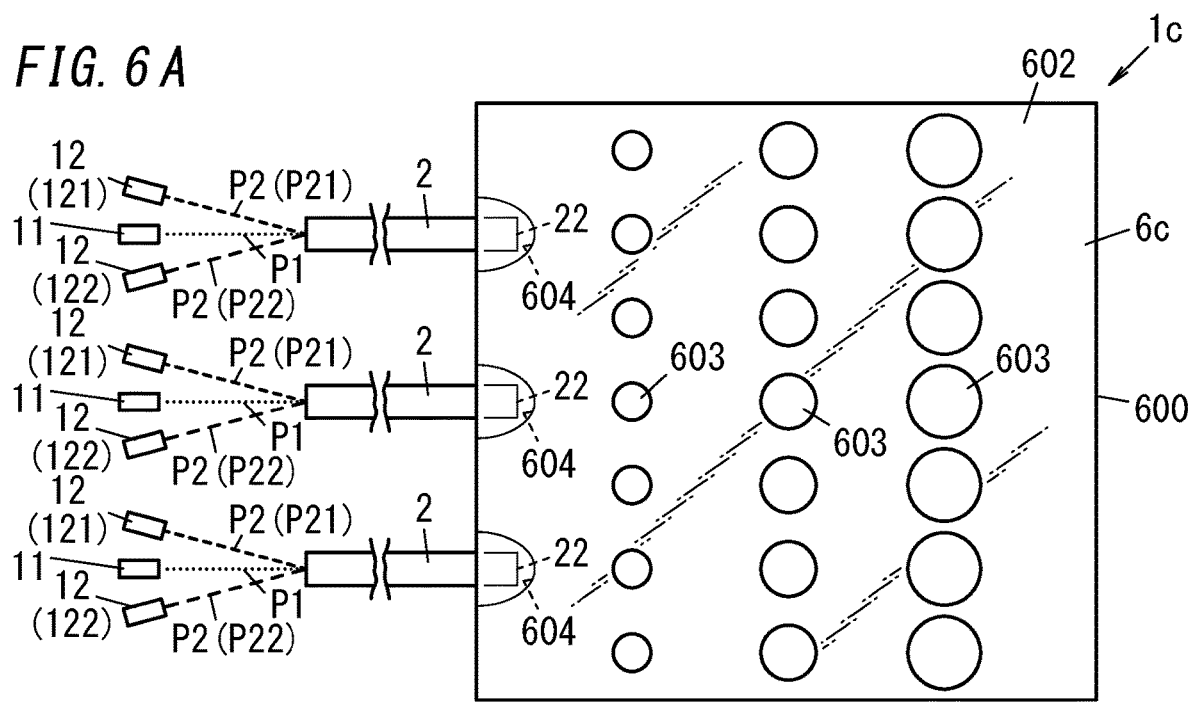
FIG. 6A is a plan view of a light-emitting system according to a fourth embodiment.
Figure 6B:
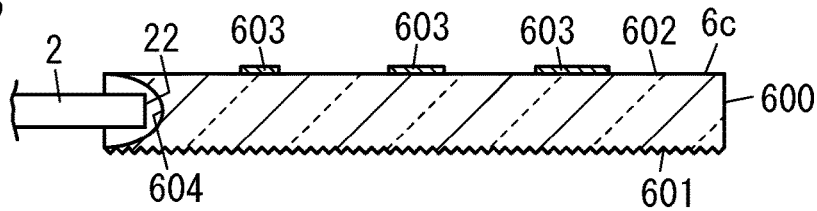
FIG. 6B is a cross-sectional view illustrating a main part of the light-emitting system.

Next, a light-emitting system 1c according to a fourth embodiment will be described with reference to FIGS. 6A and 6B. In the following description, any constituent element of the light-emitting system 1c according to this fourth embodiment, having the same function as a counterpart of the light-emitting system 1 of the first embodiment described above, will be designated by the same reference numeral as that counterpart's, and description thereof will be omitted herein. Note that although not shown in FIG. 6A or 6B, the light-emitting system 1c includes the same housing and adjustment unit as the housing 10 and the adjustment unit 7 of the light-emitting system 1 according to the first embodiment.

The light-emitting system 1c according to the fourth embodiment includes a light-guiding member 6c instead of the light-guiding member 6 of the light-emitting system 1 according to the first embodiment, which is a difference from the light-emitting system 1 according to the first embodiment. In addition, the light-emitting system 1c according to the fourth embodiment includes a plurality of (e.g., three in the example illustrated in FIGS. 6A and 6B) optical fibers 2.

The light-guiding member 6c is a light guide plate. More specifically, the light-guiding member 6c includes a light guide plate body 600 in the shape of a rectangular plate and a plurality of reflective portions 603. The light guide plate body 600 includes a plurality of light incident surfaces 604 corresponding one to one to the plurality of optical fibers 2. Each of the plurality of light incident surfaces 604 is a recessed surface. The light guide plate body 600 has a first principal surface 601 and a second principal surface 602 intersecting with the thickness direction defined for the light guide plate body 600. The plurality of reflective portions 603 are provided on the second principal surface 602 of the light guide plate body 600. The first principal surface 601 of the light guide plate body 600 has an uneven structure for letting the light guided through the light-guiding member 6c emerge into the external space.

In the light-emitting system 1c according to the fourth embodiment, at least part of the light coming from each optical fiber 2 is allowed to emerge from the first principal surface 601 of the light guide plate body 600 of the light-guiding member 6c.

The light-emitting system 1c according to the fourth embodiment includes the wavelength-converting portions 23 (see FIG. 2) each containing the wavelength-converting element, the first light source units 11, the second light source units 12, and the light-guiding member 6c. This allows the light-emitting system 1c according to the fourth embodiment, as well as the light-emitting system 1 according to the first embodiment, to increase the intensity of light (i.e., the stimulated emission of light P3) having a different wavelength from the excitation light P1.

The light-emitting system 1c according to the fourth embodiment is applicable to, for example, a guidance light system or a display system. In that case, an appropriate notation may be printed on the first principal surface 601 of the light guide plate body 600. Alternatively, a light-transmitting panel with an appropriate notation may be disposed on the first principal surface 601 of the light guide plate body 600.

(Other Variations)

Note that the first to fourth embodiments described above are only exemplary ones of various embodiments of the present disclosure and should not be construed as limiting. Rather, the first to fourth exemplary embodiments may be readily modified in various manners depending on a design choice or any other factor without departing from the scope of the present disclosure.

For example, in the optical fiber 2, the number of the wavelength-converting portion(s) 23 provided between the light incident portion 21 and the light emerging portion 22 does not have to be one but may also be multiple, for example. In the latter case, the plurality of wavelength-converting portions 23 are arranged side by side along the optical axis of the core 3.

In the optical fiber 2 described above, the wavelength-converting portion 23 is approximately as long as the core 3. However, this is only an example and should not be construed as limiting. Alternatively, the wavelength-converting portion 23 may also be shorter than the core 3.

The laser light source included in the first light source unit 11 does not have to be a semiconductor laser diode that emits a blue laser beam but may also be, for example, a semiconductor laser diode that emits a violet laser beam. Furthermore, the first light source unit 11 does not have to include the semiconductor laser diode but may have a configuration including, for example, a light-emitting diode (LED) light source and an optical system.

The second light source unit 121 does not have to be a semiconductor laser diode that emits a green laser beam but may also be an LED that emits a green light ray. The second light source unit 122 does not have to be a semiconductor laser diode that emits a red laser beam but may also be an LED that emits a red light ray.

Furthermore, the relative arrangement of the first light source unit 11 and the plurality of second light source units 12 with respect to the light incident portion 21 of the optical fiber 2 does not have to be one of the relative arrangements described for the first to fourth embodiments. For example, in the light-emitting system 1, the relative arrangement of the first light source unit 11 and the plurality of second light source units 12 with respect to the light incident portion 21 of the optical fiber 2 may be changed by disposing a cross dichroic prism between the first light source unit 11 and the plurality of second light source units 12 and the light incident portion 21 of the optical fiber 2.

Furthermore, in the light-emitting systems 1, 1a, 1b, 1c, a plurality of second light source units 12 are provided for a single optical fiber 2. However, this is only an example and should not be construed as limiting. Rather, at least one second light source unit 12 has only to be provided for a single optical fiber 2.

The adjustment unit 7 only needs to adjust the intensity of seed light P2 having at least one wavelength among the plurality of seed light rays P2. The adjustment unit 7 may be, for example, a liquid crystal filter which is disposed on an optical path of the seed light P2 between the second light source unit 12 and the light incident portion 21 of the optical fiber 2 and which may adjust the transmittance of the seed light P2.

Furthermore, in the light-emitting system 1b according to the third embodiment, the number of the optical fibers 2 provided does not have to be two but may also be three or more. In that case, the light-emitting system 1b may include, for example, five optical fibers 2 and two light-guiding members 6. Three out of the five optical fibers 2 may be connected to one light-guiding member 6 and the other two optical fibers 2 may be connected to the other light-guiding member 6.

Furthermore, in the light-emitting system 1b, the plurality of optical fibers 2 are bundled together and directly connected to the light-guiding member 6. However, this is only an example and should not be construed as limiting. Alternatively, the light-guiding member 6 may include a plurality of first light-guiding portions which are connected one to one to the plurality of optical fibers 2 and a single second light-guiding portion which is connected to the plurality of first light-guiding portions.

Furthermore, in the light-emitting systems 1b, 1c, the first light source unit 11 and the plurality of second light source units 12 are provided for each of the plurality of optical fibers 2. However, this is only an example and should not be construed as limiting. Alternatively, the light-emitting system 1b, 1c may each include a first beam splitter which makes the excitation light P1 emitted from the first light source unit 11 incident on the plurality of optical fibers 2 and a plurality of second beam splitters which make the seed light rays P2 emitted from the plurality of second light source units 12 respectively incident on the plurality of optical fibers 2 with respect to the set of the first light source unit 11 and the plurality of second light source units 12.

(Aspects)

The first to fourth embodiments and their variations described above may be specific implementations of the following aspects of the present disclosure.

A light-emitting system (1; 1a; 1b; 1c) according to a first aspect includes an optical fiber (2), a first light source unit (11), a second light source unit (12), and a light-guiding member (6; 6a; 6c). The optical fiber (2) includes a wavelength-converting portion (23) containing a wavelength-converting element. The wavelength-converting element may be excited by excitation light (P1) to produce a spontaneous emission of light having a longer wavelength than the excitation light (P1) and may also be excited by an amplified spontaneous emission of light. The first light source unit (11) makes the excitation light (P1) incident on the optical fiber (2). The second light source unit (12) makes seed light (P2) incident on the optical fiber (2). The seed light (P2) causes the wavelength-converting element that has been excited by either the excitation light (P1) or the amplified spontaneous emission of light to produce a stimulated emission of light (P3). The light-guiding member (6; 6a; 6c) guides the light coming from the optical fiber (2) and lets the light emerge therefrom.

The light-emitting system (1; 1a; 1b; 1c) according to the first aspect enables increasing the intensity of light (stimulated emission of light P3) having a different wavelength from the excitation light (P1).

In a light-emitting system (1; 1a; 1b; 1c) according to a second aspect, which may be implemented in conjunction with the first aspect, the excitation light (P1) has a wavelength equal to or longer than 350 nm and equal to or shorter than 500 nm.

The light-emitting system (1; 1a; 1b; 1c) according to the second aspect enables exciting the wavelength-converting element more efficiently.

A light-emitting system (1; 1a; 1b; 1c) according to a third aspect, which may be implemented in conjunction with the first or second aspect, further includes an adjustment unit (7). The adjustment unit (7) adjusts intensity of the seed light (P2).

The light-emitting system (1; 1a; 1b; 1c) according to the third aspect enables adjusting the chromaticity of the light emerging from the light-guiding member (6; 6a; 6c).

A light-emitting system (1; 1a; 1b; 1c) according to a fourth aspect, which may be implemented in conjunction with any one of the first to third aspects, includes a plurality of the second light source units (12). The plurality of the second light source units (12) respectively emit multiple rays of the seed light (P2). The multiple rays of the seed light (P2) emitted from the plurality of second light source units (12) have mutually different wavelengths.

The light-emitting system (1; 1a; 1b; 1c) according to the fourth aspect allows light, including multiple rays of stimulated emission of light (P3) corresponding one to one to the multiple rays of the seed light (P2), to emerge from the light-guiding member (6; 6a; 6c), thus contributing to improving the color rendering index.

In a light-emitting system (1; 1a; 1b) according to a fifth aspect, which may be implemented in conjunction with any one of the first to fourth aspects, the light-guiding member (6; 6a) has a side surface (61; 651, 661) and an end face (62; 662) opposite from the optical fiber (2). The light-guiding member (6; 6a) lets at least part of the light coming from the optical fiber (2) emerge through the side surface (61; 651, 661) of the light-guiding member (6; 6a).

In a light-emitting system (1; 1b) according to a sixth aspect, which may be implemented in conjunction with any one of the first to fifth aspects, the light-guiding member (6) is linear.

The light-emitting system (1; 1b) according to the sixth aspect contributes to reducing the size and weight of the light-guiding member (6) while expanding the irradiation range of the light emerging from the light-guiding member (6).

In a light-emitting system (1a) according to a seventh aspect, which may be implemented in conjunction with any one of the first to sixth aspects, the light-guiding member (6a) includes: a first light-guiding portion (65) directly connected to the optical fiber (2); and a plurality of second light-guiding portions (66) branching from the first light-guiding portion (65).

The light-emitting system (1a) according to the seventh aspect enables expanding the irradiation range of the light emerging from the light-guiding member (6a).

A light-emitting system (1b; 1c) according to an eighth aspect, which may be implemented in conjunction with any one of the first to seventh aspects, includes a plurality of the optical fibers (2). The light-guiding member (6; 6c) guides the light coming from at least two optical fibers (2), out of the plurality of the optical fibers (2), and let the light emerge therefrom.

The light-emitting system (1b; 1c) according to the eighth aspect enables increasing the quantity of light emerging from the light-guiding member (6; 6c).

In a light-emitting system (1; 1a; 1b; 1c) according to a ninth aspect, which may be implemented in conjunction with any one of the first to eighth aspects, the first light source unit (11) includes a laser light source.

The light-emitting system (1; 1a; 1b; 1c) according to the ninth aspect enables increasing the intensity of the excitation light (P1).

In a light-emitting system (1; 1a; 1b; 1c) according to a tenth aspect, which may be implemented in conjunction with any one of the first to ninth aspects, the second light source unit (12) includes a laser light source.

The light-emitting system (1; 1a; 1b; 1c) according to the tenth aspect enables increasing the intensity of the seed light (P2).

In a light-emitting system (1; 1a; 1b; 1c) according to an eleventh aspect, which may be implemented in conjunction with any one of the first to tenth aspects, the wavelength-converting element includes one or more elements selected from the group consisting of Pr, Tb, Ho, Dy, Er, Eu, Nd, and Mn.

The light-emitting system (1; 1a; 1b; 1c) according to the eleventh aspect enables, when the wavelength-converting element includes two or more elements, for example, excitation caused by the amplified spontaneous emission of light from at least one element to produce an amplified spontaneous emission of light from another element at a different wavelength.

REFERENCE SIGNS LIST 1, 1a 1b, 1c Light-Emitting System
2 Optical Fiber
21 Light Incident Portion
22 Light Emerging Portion
23 Wavelength-Converting Portion
6, 6a, 6c Light-Guiding Member
61 Side Surface
62 End Face
65 First Light-Guiding Portion
651 Side Surface
66 Second Light-Guiding Portion
661 Side Surface
662 End Face
7 Adjustment Unit
11 First Light Source Unit
12 Second Light Source Unit
121 Second Light Source Unit
122 Second Light Source Unit
P1 Excitation Light
P2 Seed Light
P21 Seed Light Ray
P22 Seed Light Ray
P3 Stimulated Emission of Light

The invention claimed is:

1. A light-emitting system comprising:
a plurality of optical fibers, each of which including a wavelength-converting portion containing a wavelength-converting element, the wavelength-converting element being able to be excited by excitation light to produce a spontaneous emission of light having a longer wavelength than the excitation light and also excited by an amplified spontaneous emission of light;
a plurality of first light source units associated one-to-one with the plurality of optical fibers, each of the plurality of first light source units being configured to emit the excitation light to an associated one of the plurality of optical fibers;
a plurality of second light source units, each of the plurality of optical fibers being associated with at least two of the plurality of second light source units, each of the plurality of second light source units being configured to emit seed light to an associated one of the plurality of optical fibers, the seed light causing the wavelength-converting element that has been excited by either the excitation light or the amplified spontaneous emission of light to produce a stimulated emission of light; and
a light-guiding member,
wherein the wavelength-converting element includes $Pr^{3+}$ and $Tb^{3+}$,
the excitation light has a wavelength equal to or longer than 350 nm and equal to or shorter than 500 nm, and
the light-guiding member is configured to receive respective light from the plurality of optical fibers, guide the light, and allow the light to emerge from the light-guiding member.

2. The light-emitting system of claim 1, further comprising an adjustment unit configured to adjust intensity of the seed light.

3. The light-emitting system of claim 1, wherein
the at least two of the plurality of the second light source units associated with one of the plurality of optical fibers respectively emit multiple rays of the seed light, and
the multiple rays of the seed light emitted from the at least two of the plurality of the second light source units have mutually different wavelengths.

4. The light-emitting system of claim 1, wherein
the light-guiding member has a surface receiving the light from the plurality of optical fibers, a side surface and an end face opposite from the plurality of optical fibers, and
the light-guiding member is configured to allow at least part of the light coming from the plurality of optical fibers to emerge through the side surface.

5. The light-emitting system of claim 1, wherein
the light-guiding member is linear.

6. The light-emitting system of claim 1, wherein
each of the plurality of first light source units includes a laser light source.

7. The light-emitting system of claim 1, wherein
each of the plurality of second light source units includes a laser light source.

* * * * *